United States Patent
Hsiao et al.

(10) Patent No.: US 12,356,582 B2
(45) Date of Patent: Jul. 8, 2025

(54) POWER MODULE STRUCTURE

(71) Applicant: CHICONY POWER TECHNOLOGY CO., LTD., New Taipei (TW)

(72) Inventors: Yung-Hung Hsiao, New Taipei (TW); Chia-Hsien Yen, New Taipei (TW); Chun-Hsiung Yeh, New Taipei (TW); Cheng-Chang Hsiao, New Taipei (TW); Yu-Chen Wu, New Taipei (TW)

(73) Assignee: CHICONY POWER TECHNOLOGY CO., LTD., New Taipei (TW)

( * ) Notice: Subject to any disclaimer, the term of this patent is extended or adjusted under 35 U.S.C. 154(b) by 223 days.

(21) Appl. No.: 18/205,493

(22) Filed: Jun. 2, 2023

(65) Prior Publication Data

US 2024/0292560 A1    Aug. 29, 2024

(30) Foreign Application Priority Data

Feb. 24, 2023   (TW) ................................ 112201663

(51) Int. Cl.
| | |
|---|---|
| *H05K 7/20* | (2006.01) |
| *G06F 1/18* | (2006.01) |
| *H01R 13/74* | (2006.01) |
| *H05K 7/14* | (2006.01) |

(52) U.S. Cl.
CPC ......... *H05K 7/20172* (2013.01); *G06F 1/188* (2013.01); *H01R 13/748* (2013.01); *H05K 7/14325* (2022.08)

(58) Field of Classification Search
CPC ........... H05K 7/20172; H05K 7/14325; G06F 1/188; H01R 13/748

USPC ......................................................... 361/695
See application file for complete search history.

(56) References Cited

U.S. PATENT DOCUMENTS

| | | | |
|---|---|---|---|
| 11,051,424 B2* | 6/2021 | Ke ..................... | H05K 7/20172 |
| 2003/0043548 A1* | 3/2003 | Cheng ....................... | G06F 1/26 361/720 |
| 2008/0266817 A1* | 10/2008 | Li ....................... | H05K 5/0247 361/747 |

(Continued)

FOREIGN PATENT DOCUMENTS

| | | |
|---|---|---|
| CN | 208487039 U | 2/2019 |
| CN | 210008095 U | 1/2020 |
| TW | 201312325 A | 3/2013 |

(Continued)

*Primary Examiner* — Zhengfu J Feng
(74) *Attorney, Agent, or Firm* — Chun-Ming Shih; hdls ipr services

(57) ABSTRACT

A power module structure includes a first housing, a second housing, a wind generating unit and a power socket. The first housing includes a first plate and a first side portion. The second housing is attached to the first housing and includes a second plate arranged opposite to the first plate and a second side portion arranged opposite to the first side portion. Furthermore, a ventilation bracket is integrally bent and extended from the second housing and provided for the installation of the wind generating unit. The power socket is arranged side by side with the wind generating unit. The power socket and the wind generating unit are located between the first plate and the second plate. Moreover, the ventilation bracket includes a securement portion, and the securement portion is extended to inside of the first plate or the second plate for securement.

18 Claims, 15 Drawing Sheets

(56) References Cited

U.S. PATENT DOCUMENTS

2021/0282297 A1    9/2021   Ke et al.

FOREIGN PATENT DOCUMENTS

| TW | M577530   U | * | 5/2019  | ............... G06F 1/26 |
| TW | 1685286   B | * | 2/2020  | ............. H05K 13/04 |
| TW | I685286   B |   | 2/2020  |  |
| TW | 695670    B |   | 6/2020  |  |
| TW | 202037258 A |   | 10/2020 |  |

* cited by examiner

POWER MODULE STRUCTURE

TECHNICAL FIELD

The present disclosure relates to a power supply, and in particular, to a power module structure with a reduced width via the chassis structural design.

DESCRIPTION OF RELATED ART

Presently, a related-art power supply applied to a server typically requires the installation of an internal computer fan for cooling and is equipped with a power socket of, such as, IEC C14 standard. Since the computer fan and power socket requires to comply with a certain safety regulation and specification and dimension of relevant associations, they are configured and assembled based on market available standard products. In addition, to meet the high wattage and limited space design requirements of power supply, it is preferable to have a larger size of the computer fan installed inside, in order to provide the cooling efficiency necessary for the high wattage of power supply.

As shown in FIG. 1 and FIG. 2, with regard to the configuration of a computer fan 8 and a power socket 9 of a related-art power supply 7, the computer fan 8 and the power socket 9 are installed at one identical side of the power supply 7, and a ventilation cap 70 for heat exhaust of the computer fan 8 is arranged on such side. As shown in FIG. 3, to reduce the dimension of width w, the current method is typically to reserve a distance d from the air output surface 80 of the computer fan 8 rearward along a length direction of the power socket 9, in order to allow the computer fan 8 to be partially adjacent to one side at the rear of the power socket 9. Accordingly, the width w of the power supply 7 may be reduced to the width w1 of the computer fan 8 plus the width w2 of the power socket 9, followed by deduction of the partially overlapping width w3 of the two (i.e., w=w1+w2−w3), in order to achieve the objective of reducing the width w.

However, despite that the above method is feasible, it also introduces other issues that may affect its cooling efficiency. The distance d between the air output surface 80 of the computer fan 8 and the ventilation cap 70 causes the generation of an ineffective zone 71. Such ineffective zone 71 becomes a redundant space to the internal space of the power supply 7 and also causes the hot air drawn by the computer fan 8 to pass the ineffective zone 71 in order to be exhausted to the external of the power supply 7. Consequently, the cooling and heat exhaust effects are reduced. In addition, to reduce the width w, a portion of the air output surface 80 of the cooling fan is blocked by the power socket 9. In other words, the reduced width w3 is, in fact, obtained via the reduction of the air output surface 80 of the computer fan 8. Consequently, the heat exhaust or cooling efficiency of the computer fan 8 is further affected, resulting in an ineffective design.

Moreover, an existing power supply 7 is typically manufactured via metal sheet stamping and bending, and the method of latching, screw fastening or riveting is also required after bending in order to form an integral part. The attachment portion between metal parts or sheets may also occupy a certain space for its structural shape formed via the aforementioned assembly method, such that the width w is increased.

In view of the above, the inventor seeks to improve and overcome the aforementioned drawbacks and proposes a reasonable design capable of effectively improving the aforementioned drawbacks after extensive research along with the utilization of academic principles.

SUMMARY OF PRESENT DISCLOSURE

A primary objective of the present disclosure is to provide a power module structure capable of achieving effective space configuration and design for the power module or power supply housing under various types of aforementioned limitations while maintaining the required strength of the rigid structure of housing at the same time.

To achieve the aforementioned objective, the present disclosure provides a power module structure having a first housing, a second housing, a wind generating unit and a power socket. The first housing includes a first plate and a first side portion. The second housing is attached to the first housing and includes a second plate and a second side portion. The second plate is arranged opposite to the first plate, and the second side portion is arranged opposite to the first side portion. A ventilation bracket is integrally bent and extended from the second housing. The wind generating unit is arranged on the ventilation bracket. The power socket is arranged side by side with the wind generating unit. The power socket and the wind generating unit are located between the first plate and the second plate. In addition, the ventilation bracket includes a securement portion, and the securement portion is extended to an internal of the first plate or the second plate for securement.

To achieve the aforementioned objective, the present disclosure provides a power module structure having a first housing, a second housing, a wind generating unit and a power socket. The first housing includes a first plate and a first side portion. The second housing is attached to the first housing and includes a second plate and a second side portion. The second plate is arranged opposite to the first plate, and the second side portion is arranged opposite to the first side portion. A ventilation bracket is integrally bent and extended from the second housing. The wind generating unit is arranged on the ventilation bracket. The power socket is arranged side by side with the wind generating unit. The power socket and the wind generating unit are between the first plate and the second plate. The power socket includes a socket main body the power socket and a plurality of pins extended from a rear end of the socket main body. A front end of the socket main body includes an insertion port, a shape of the insertion port includes two foolproof bevels, and the socket main body includes two slanted surfaces corresponding to the two foolproof bevels respectively and extended from the front end of the socket main body to the rear end of the socket main body. In addition, the ventilation bracket includes a grounding portion, the grounding portion is extended to the rear end of the socket main body along one of the slanted surfaces and is grounded with one of the pins.

To achieve the aforementioned objective, the present disclosure provides a power module structure having a first housing, a second housing, a wind generating unit and a power socket. The first housing includes a first plate and a first side portion. The second housing is attached to the first housing and includes a second plate and a second side portion. The second plate is arranged opposite to the first plate, and the second side portion is arranged opposite to the first side portion. A ventilation bracket is integrally bent and extended from the second housing. The wind generating unit is arranged on the ventilation bracket. The power socket is arranged side by side with the wind generating unit. The power socket and the wind generating unit are located between the first plate and the second plate, and the power socket includes a socket main body and a plurality of pins extended from a rear end of the socket main body. A front end of the socket main body includes an insertion port, a shape of the insertion port includes two foolproof bevels, and the socket main body includes two slanted surfaces corresponding to the two foolproof bevels respectively and extended from the front end of the socket main body to the rear end of the socket main body. In addition, the ventilation bracket includes a grounding portion. The grounding portion is extended to the rear end of the socket main body along one of the slanted surfaces and is grounded with one of the pins, and the ventilation bracket further includes a first securement portion and a second securement portion, the first securement portion is secured to the first plate, and the second securement portion is secured to the second plate.

With the aforementioned technical features, the present disclosure is able to adopt new design and make structural change on the housing (that is, the structure formed by first housing and second housing) of the power supply, such that under the limitation of the basic height 1U of the server, the width of the housing may be further reduced as the wind generating unit and the power socket are arranged side by side with each other. The relevant safety requirements and standards for the wind generating unit and the power socket may be satisfied, and the housing structural strength may also be maintained at the same time.

DETAILED DESCRIPTION

The technical contents of this disclosure will become apparent with the detailed description of embodiments accompanied with the illustration of related drawings as follows. It is intended that the embodiments and drawings disclosed herein are to be considered illustrative rather than restrictive.

Figure 1:
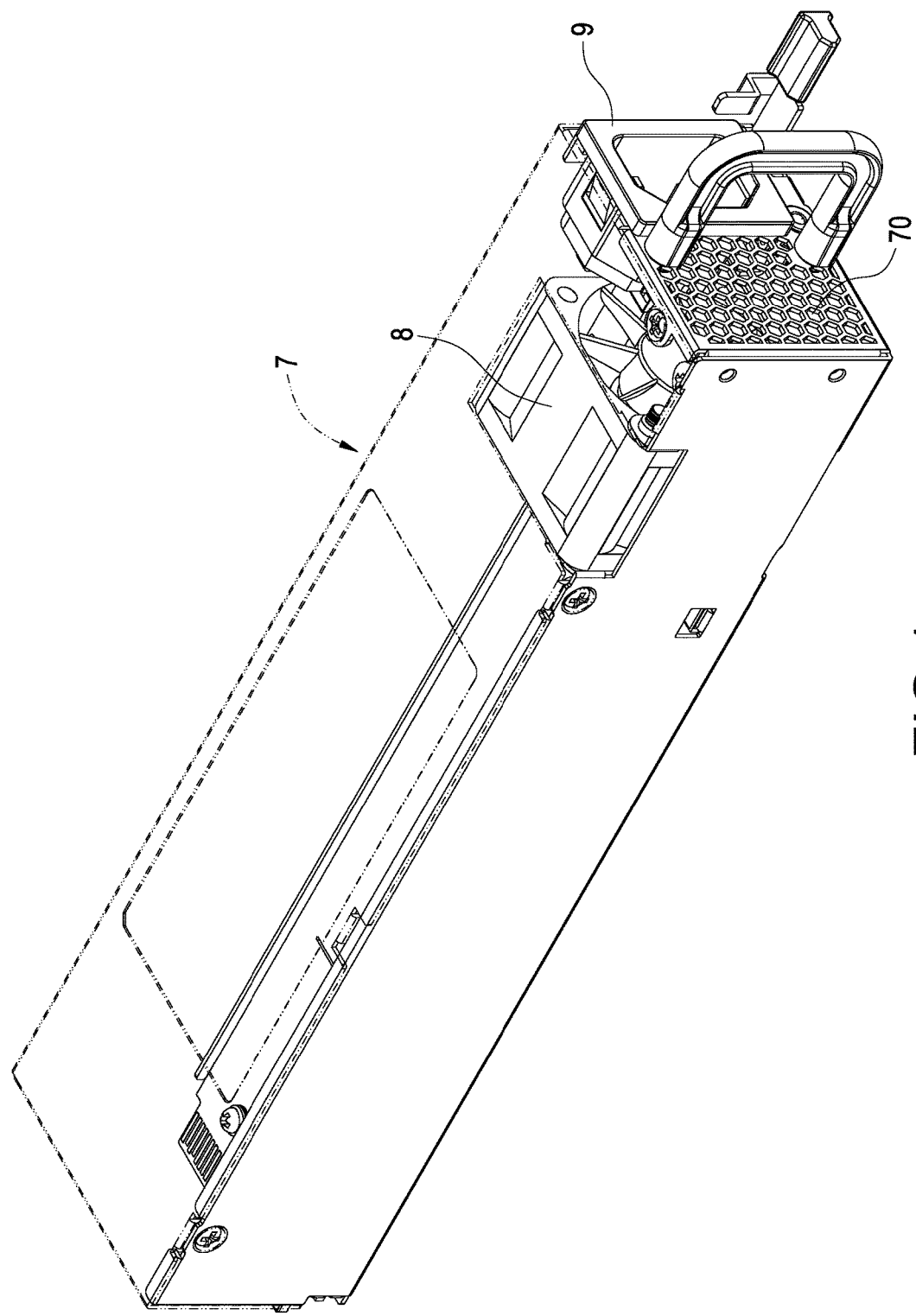
FIG. 1 is a perspective view of a related-art power supply.
Figure 2:
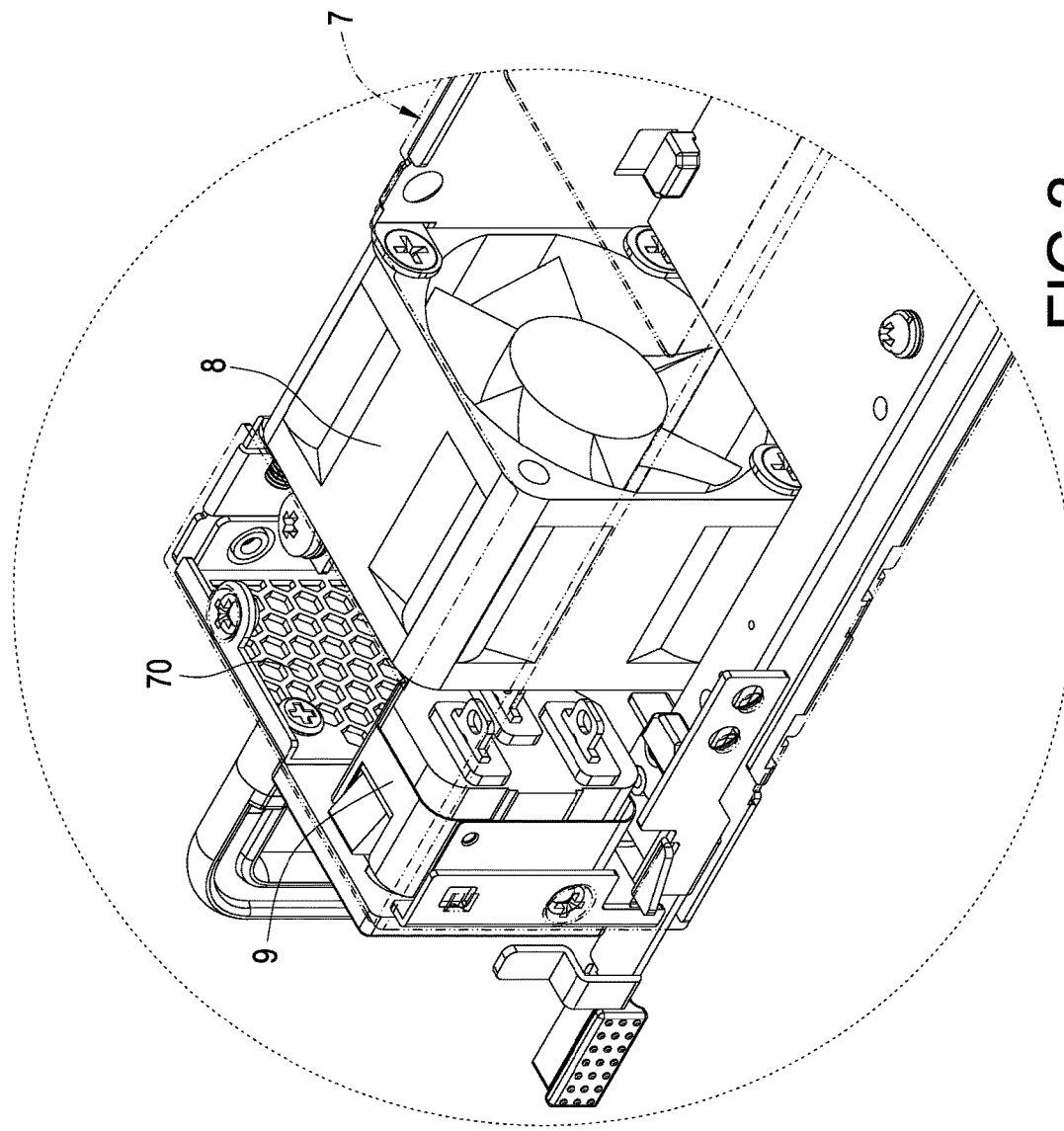
FIG. 2 is a partial perspective view of the fan and socket inside the related-art power supply.
Figure 3:
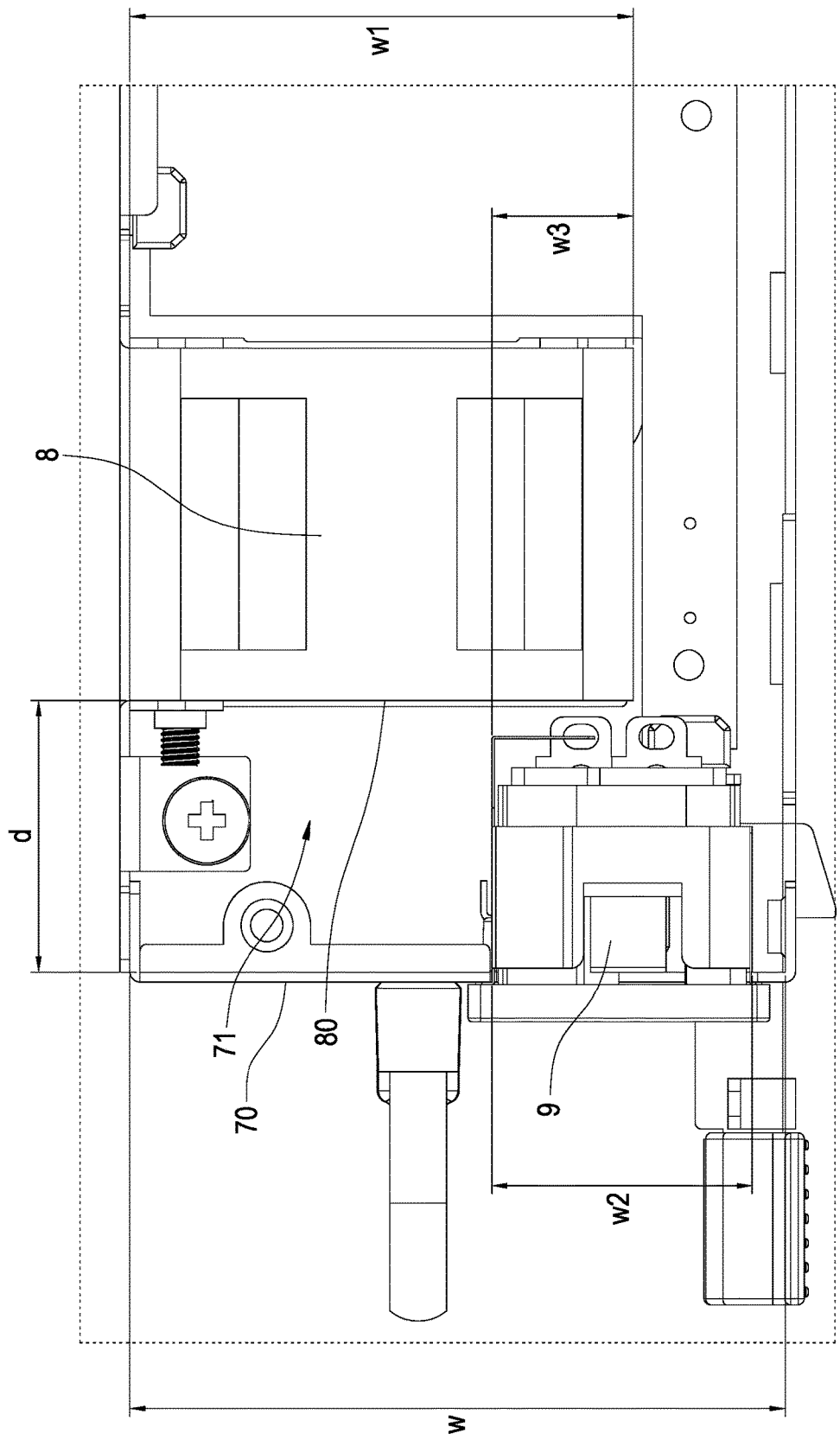
FIG. 3 is a partial top view of the fan and socket of the known power supply.
Figure 4:
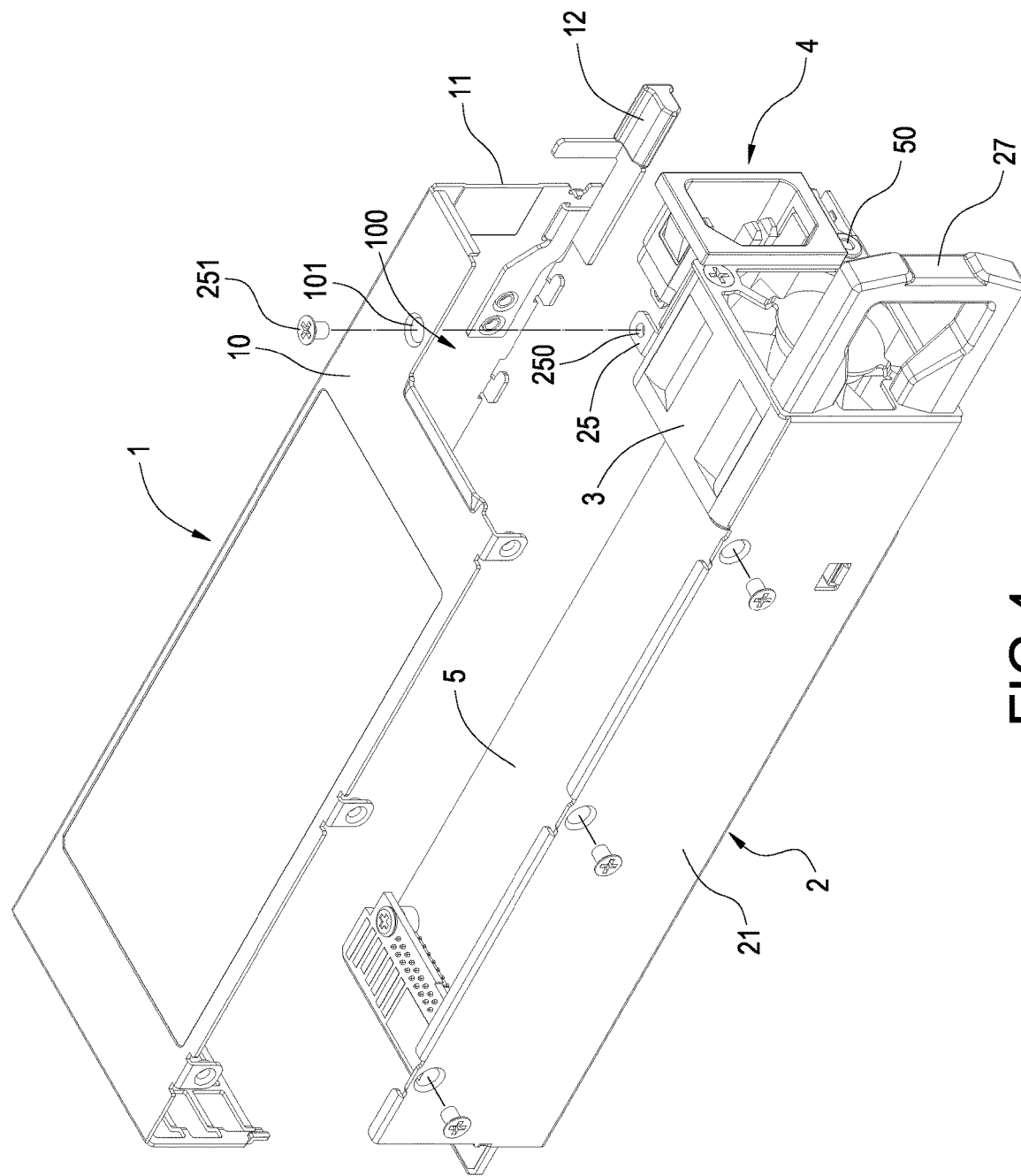
FIG. 4 is a perspective partially exploded view of the present disclosure.
Figure 5:
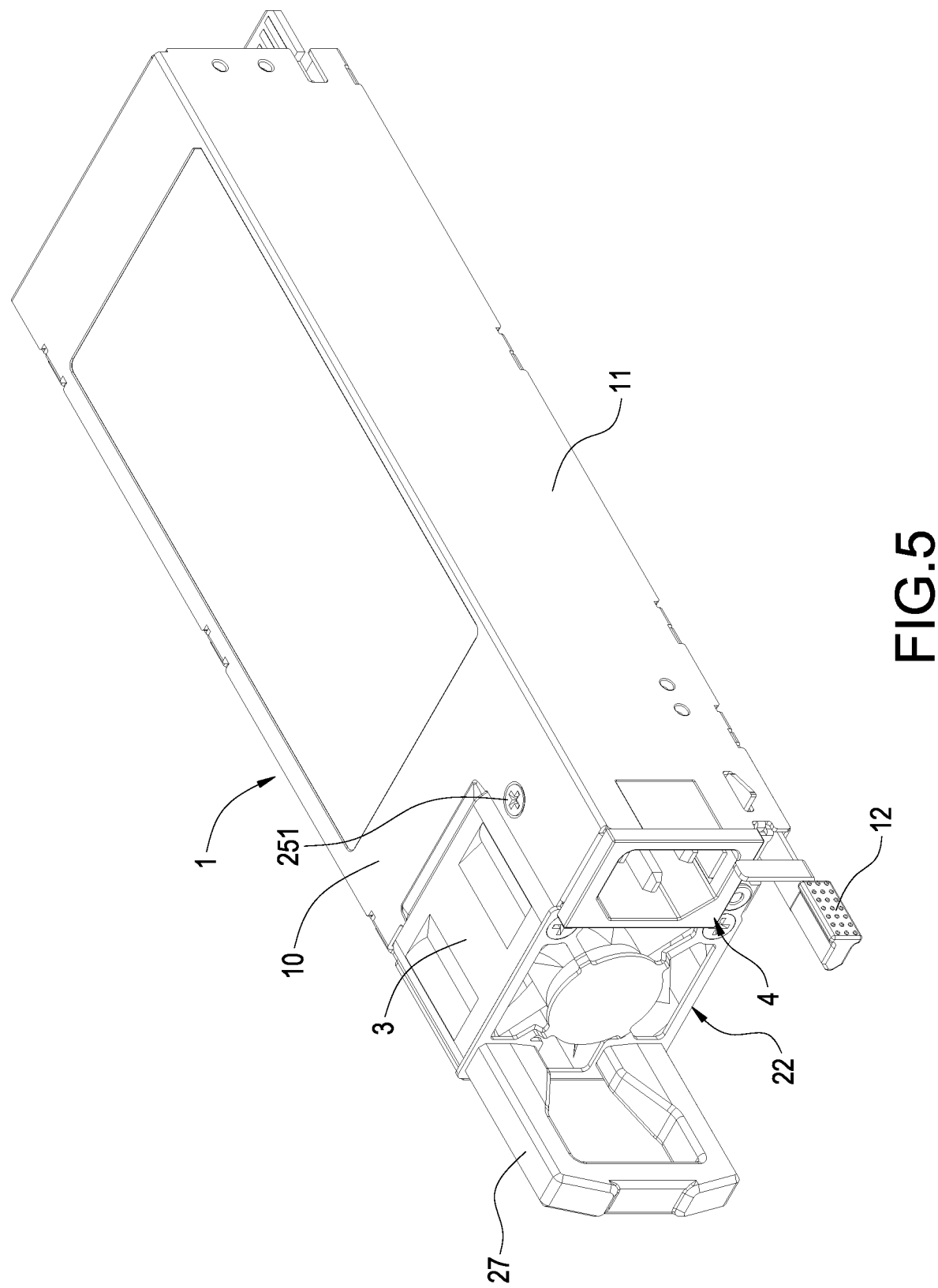
FIG. 5 is a perspective assembly view of the present disclosure from another viewing angle.

Please refer to FIG. 4 and FIG. 5, showing a perspective partially exploded view and a perspective assembly view from another angle of the present disclosure respectively. The present disclosure provides a power module structure, and to be more specific, it may be a power supply applied to, such as, a server. The present disclosure is not limited to such type only. The power module structure includes a first housing 1, a second housing 2, a wind generating unit 3 and a power socket 4. The first housing 1 and the second housing 2 are attached to each other to form the housing of the power module, and one end of the housing includes the wind generating unit 3 and the power socket 4 arranged side by side with each other. As for the actual application, the first housing 1 and the second housing 2 further includes a circuit board 5 arranged therein, and the wind generating unit 3 and the power socket 4 are electrically connected to the circuit board 5 respectively to allow the circuit board 5 to control on/off of the wind generating unit 3. In addition, the power socket 4 is connected to an external power for supply electrical power to the circuit board 5.

Figure 14:
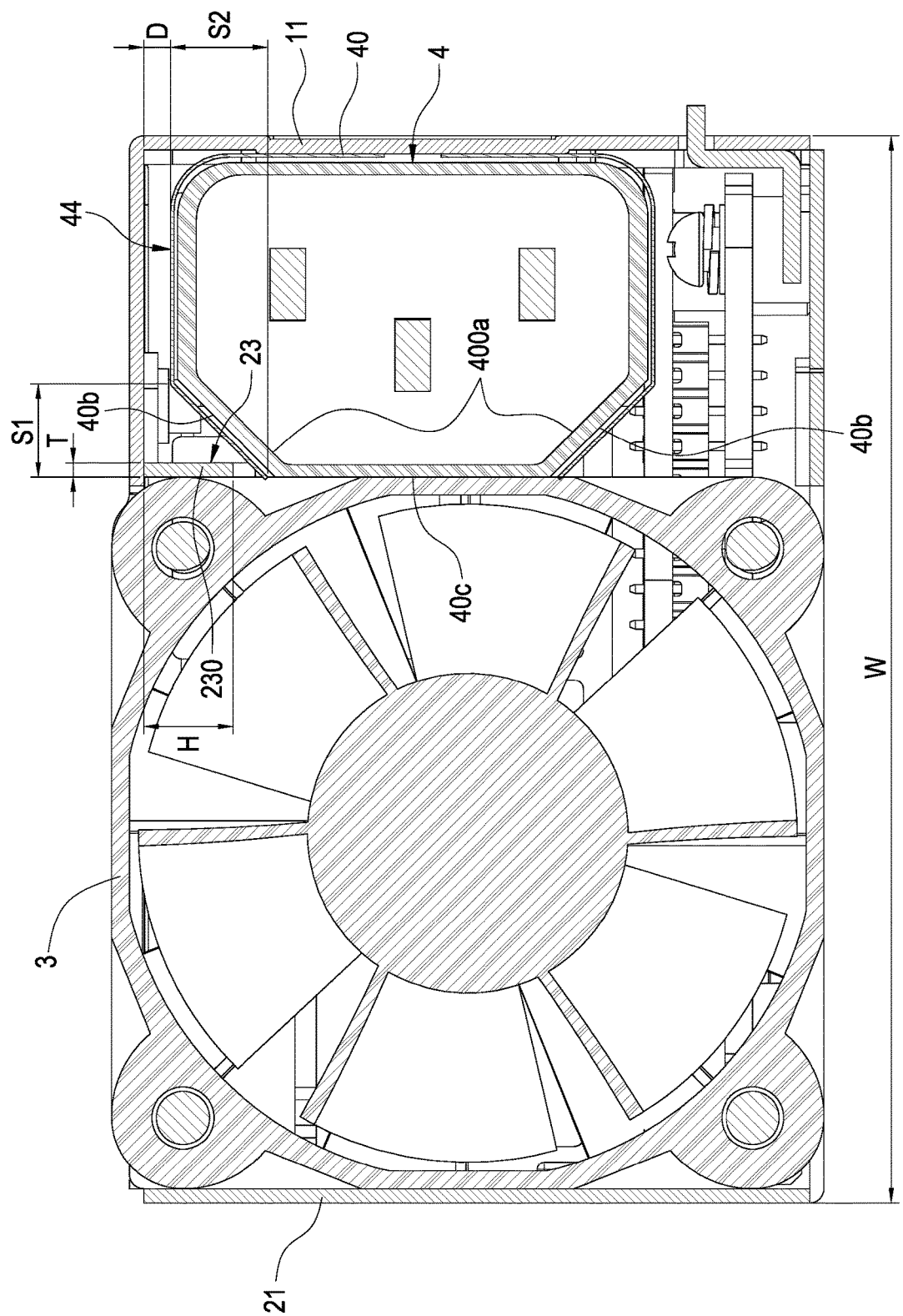
FIG. 14 is a cross sectional view of the present disclosure taken along the width direction.

According to the above description, the design basis of the present disclosure is to arrange the wind generating unit 3 and the power socket 4 parallel to each other, such that there is no ineffective zone inside the housing of the power module, allowing the wind generating unit 3 to be adjacent to one end of the housing of the power module (as shown in FIG. 4), and the hot air drawn may be exhausted to the external directly. As a result, maximum cooling efficiency may be achieved while maintaining the wind generating unit 3 at a corresponding size and specification. In view of the above, the width W (as shown in FIG. 14) needs to be at least equivalent to the total of the widths of the wind generating unit 3 and the power module 4. In addition, to prevent occupation of any additional space with respect to the width W, such as attachment of parts and plates, the present disclosure is able to effectively use the remaining space of the width W for optimal structural design.

As shown in FIG. 4, the first housing 1 includes a first plate 10 and a first side portion 11. The first plate 10 may be used as the top surface or bottom surface of the housing of the power module. The first side portion 11 is formed by bending one side of the first plate 10. In an exemplary embodiment of the present disclosure, the first housing 1 is located on top of the second housing 2 such that the first plate 10 is used as the top surface, and a first notch 100 may be formed on the first plate 10 corresponding to the top of the wind generating unit 3, allowing the upper edge of the wind generating unit 3 to be aligned with the first notch 100 or to slightly protrude out of the first notch 100, such that a larger size of cooling fan may be used as much as possible. In addition, a retainer 12 may be arranged at the inner wall of the first side portion 11 to secure the power module inside the chassis of the server. The retainer 12 is stacked underneath the power module 4 such that the any occupation of space hindering the width W of the power module may be effectively prevented.

Figure 6:
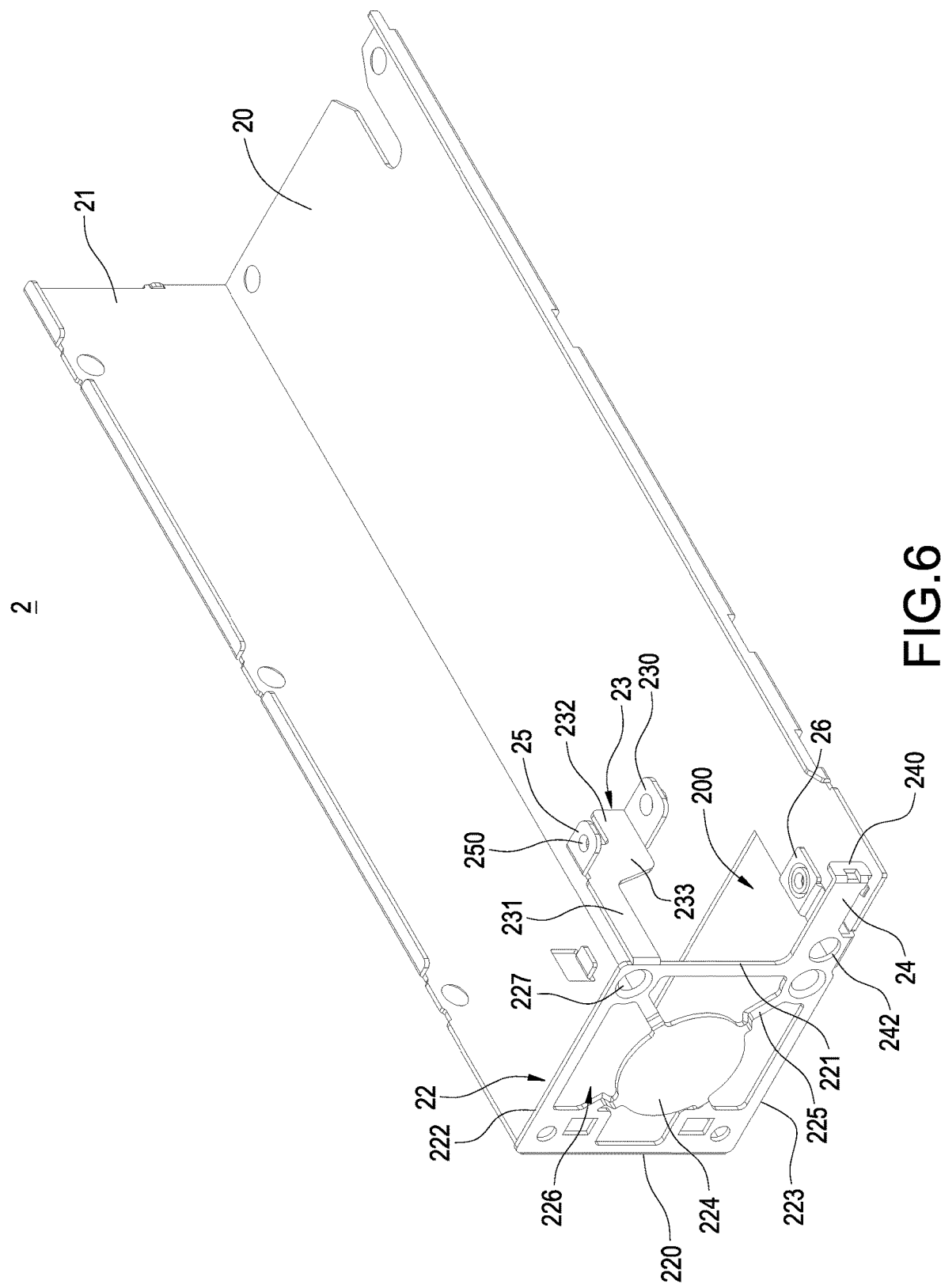
FIG. 6 is a perspective view of the second housing of the present disclosure.
Figure 7:
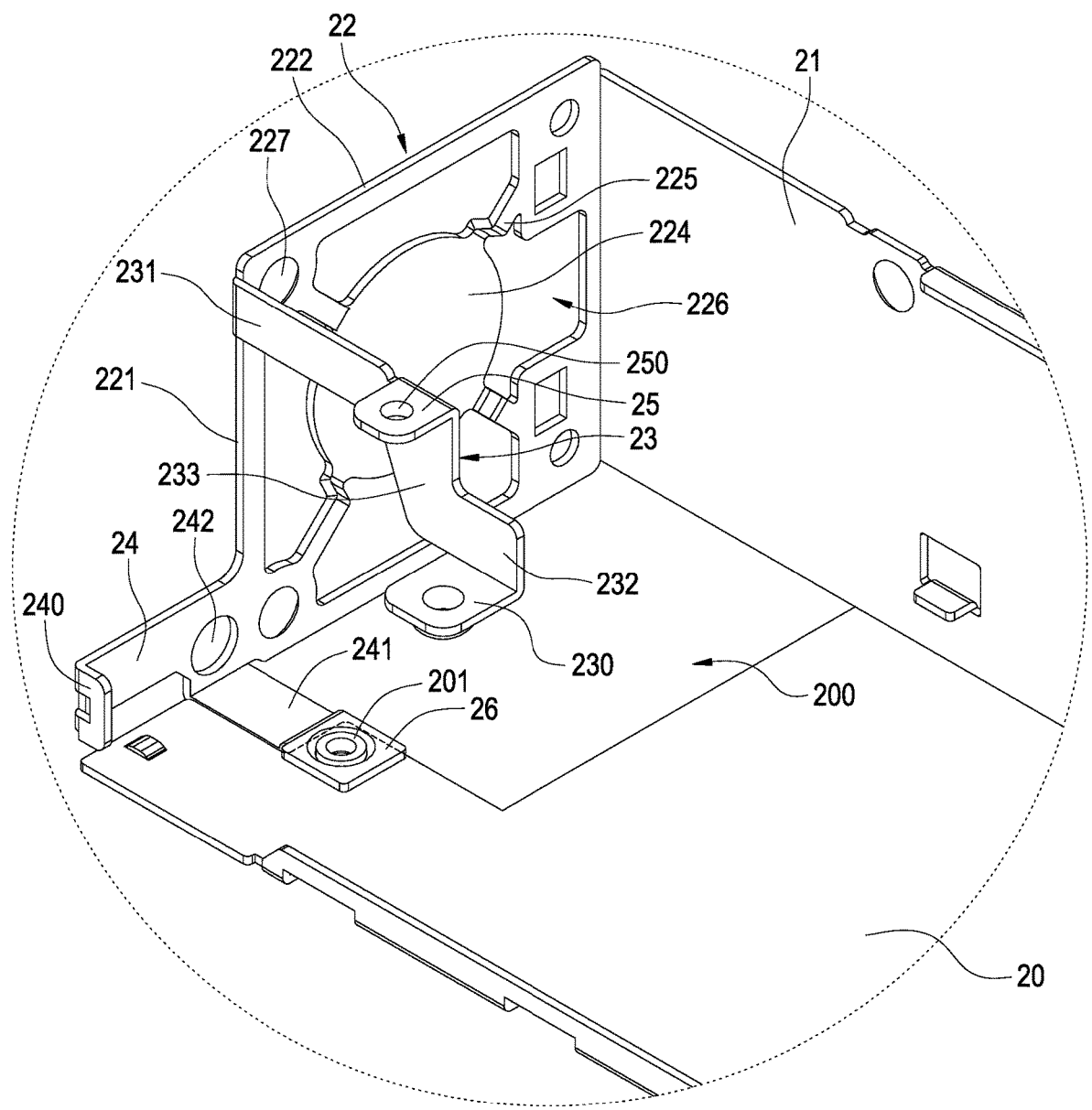
FIG. 7 is a partial perspective view of the second housing of the present disclosure from another viewing angle.

As shown in FIG. 6 and FIG. 7, the second housing 2 includes a second plate 20 and a second side portion 21. The second plate 20 may be used as the top surface or bottom surface of the housing of the power module. The second side portion 21 is formed by bending one side of the second plate 20 and is arranged corresponding to the first side portion 11 of the first housing 1. In an exemplary embodiment of the present disclosure, the second housing 2 is located at the bottom of the first housing 1 such that the second plate 20 is used as the bottom surface, and a second notch 200 may be formed on the second plate 20 corresponding to the bottom of the wind generating unit 3, allowing the lower edge of the wind generating unit 3 to be aligned with the second notch 200 or to slightly protrude out of the second notch 200. Similarly, a larger size of cooling fan may then be more probably applicable.

Figure 8:
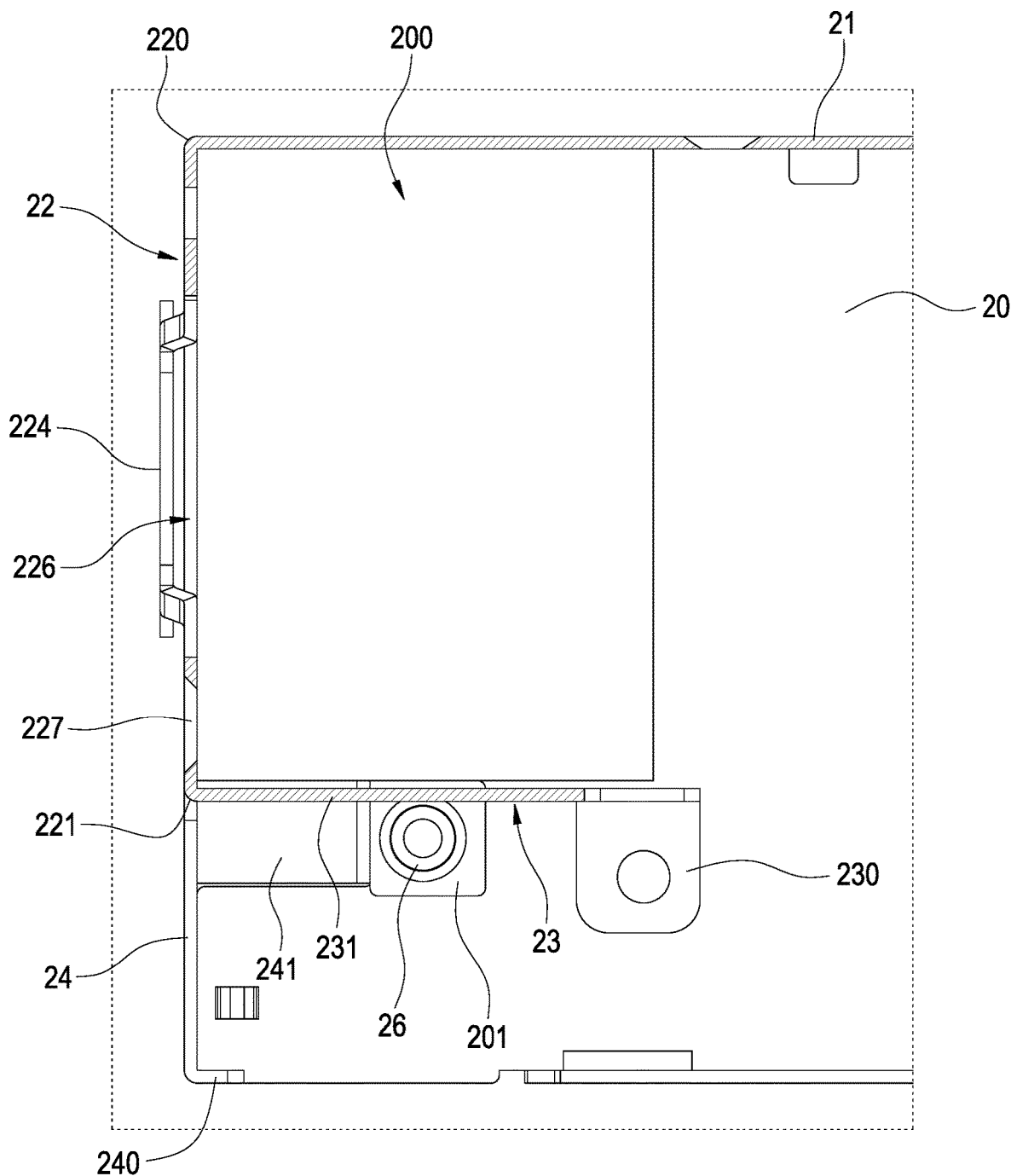
FIG. 8 is a partial top view of the second housing of the present disclosure.

Please refer to FIG. 6 to FIG. 9, the second housing 2 includes a ventilation bracket 2 integrally bent and extended therefrom. To be more specific, the ventilation bracket 22 is a fan bracket provided for the installation of the wind generating unit 3, as shown in FIG. 4 or FIG. 5. In addition, the ventilation bracket 22 includes a connecting edge 220, a lateral cutting edge 221, a first cutting edge 222 and a second cutting edge 223. As shown in FIG. 8, the connecting edge 220 is connected between the second side portion 21 and the ventilation bracket 22 such that the second side portion 21 and the ventilation bracket 22 are integrally bent and formed. The lateral cutting edge 221 refers to the side away from the connecting edge 220. The first cutting edge 222 is adjacent to the first notch 100 and the second cutting edge 223 is adjacent to the second notch 200. The ventilation bracket 22 further includes a center portion 224 corresponding to the wind generating unit 3 and a plurality of supporting ribs 225 extended outward from the center portion 224. In addition, ventilation holes 226 are formed among the supporting ribs 226 to allow the hot air blown by the wind generating unit 3 to pass through such ventilation holes 226 to be exhausted to the external of the ventilation bracket 22. Furthermore, for the wind generating unit 3, one or a plurality of screw holes 227 may be formed at the circumference or corner of the ventilation bracket 22 to allow screws or bolts to penetrate from the external of the ventilation bracket 22 or the rear end of the wind generating unit 3, thereby securing the wind generating unit 3 to the ventilation bracket 22.

Figure 10:
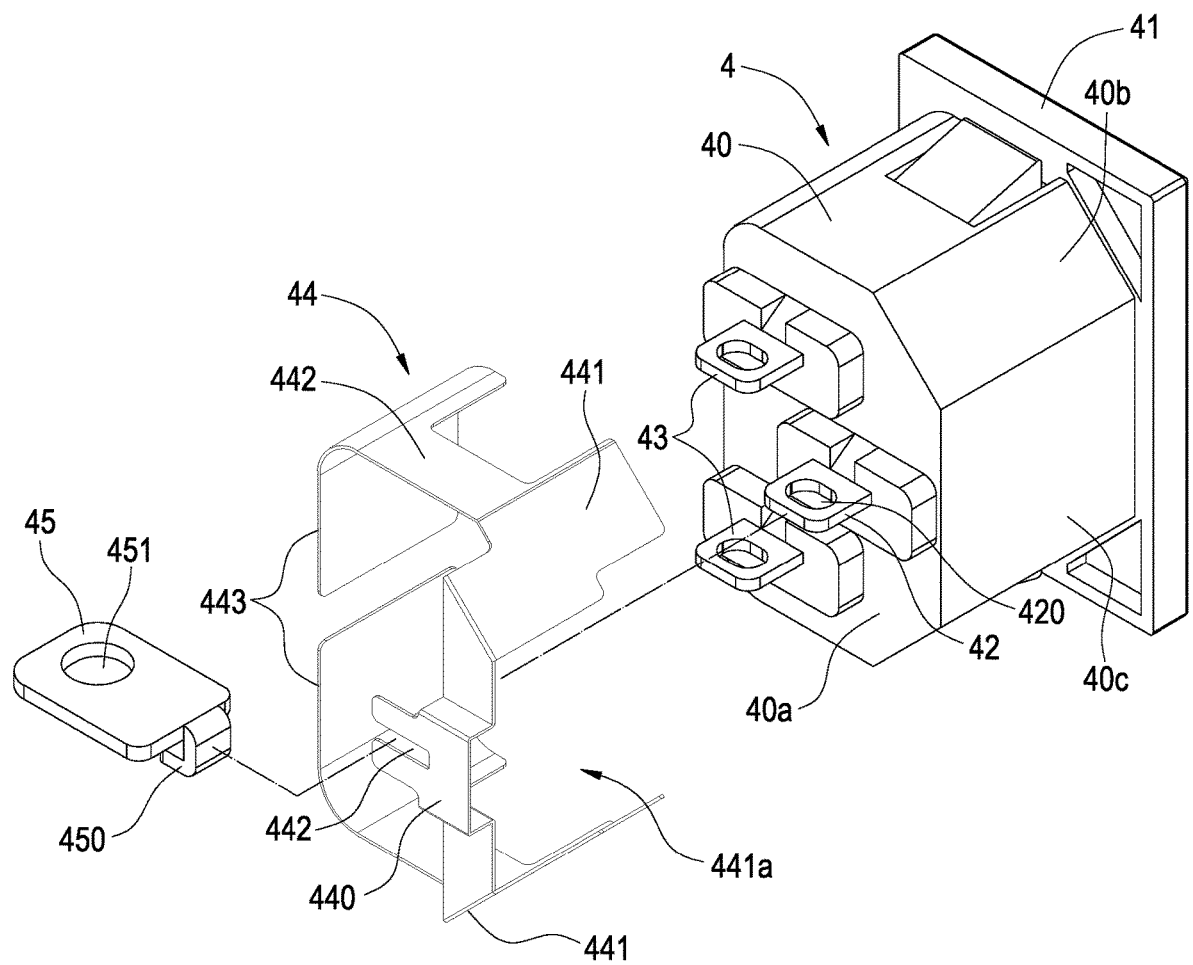
FIG. 10 is a perspective exploded view of the power socket of the present disclosure.
Figure 11:
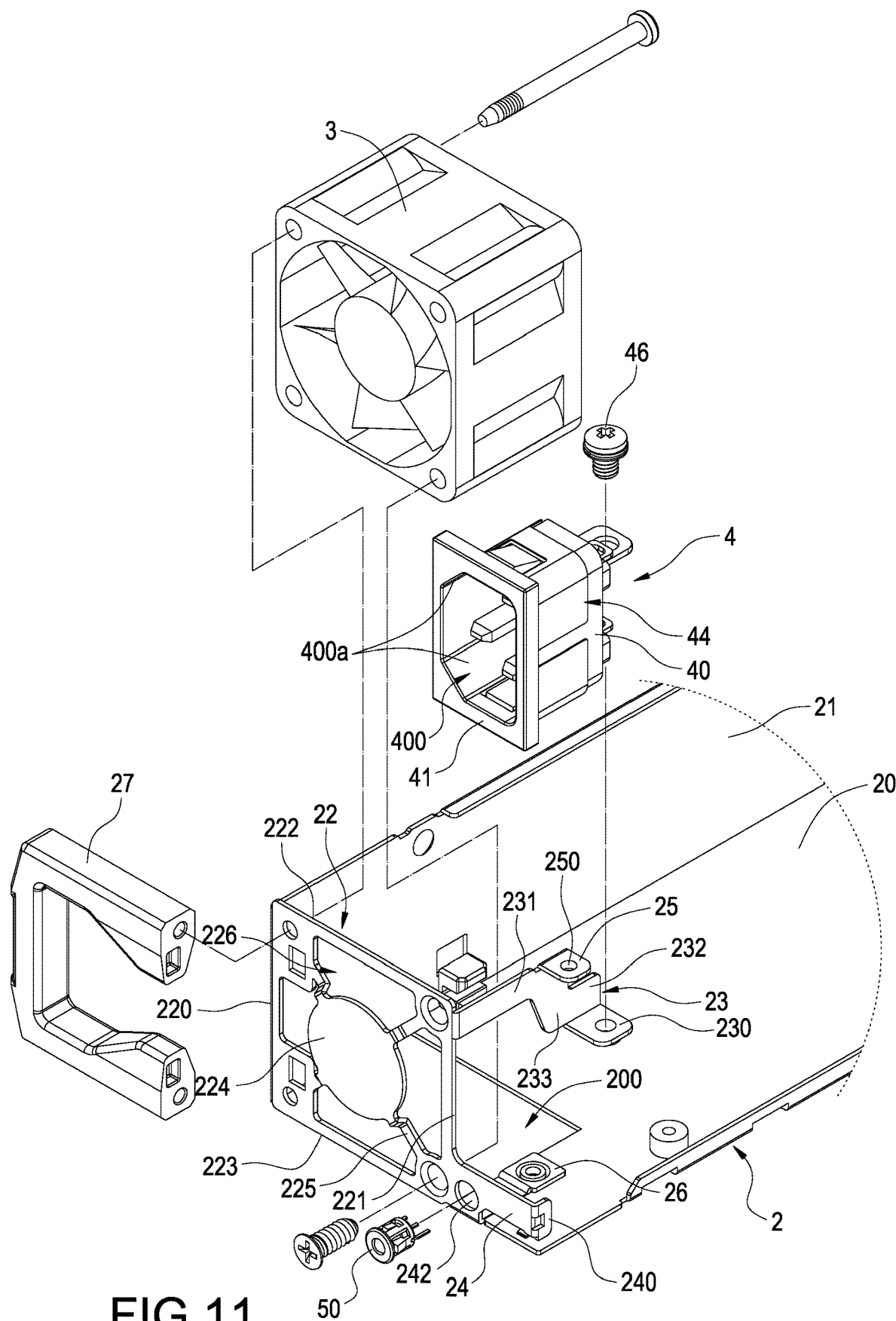
FIG. 11 is a partial exploded view of the second housing, the wind generating unit and the power socket of the present disclosure.
Figure 12:
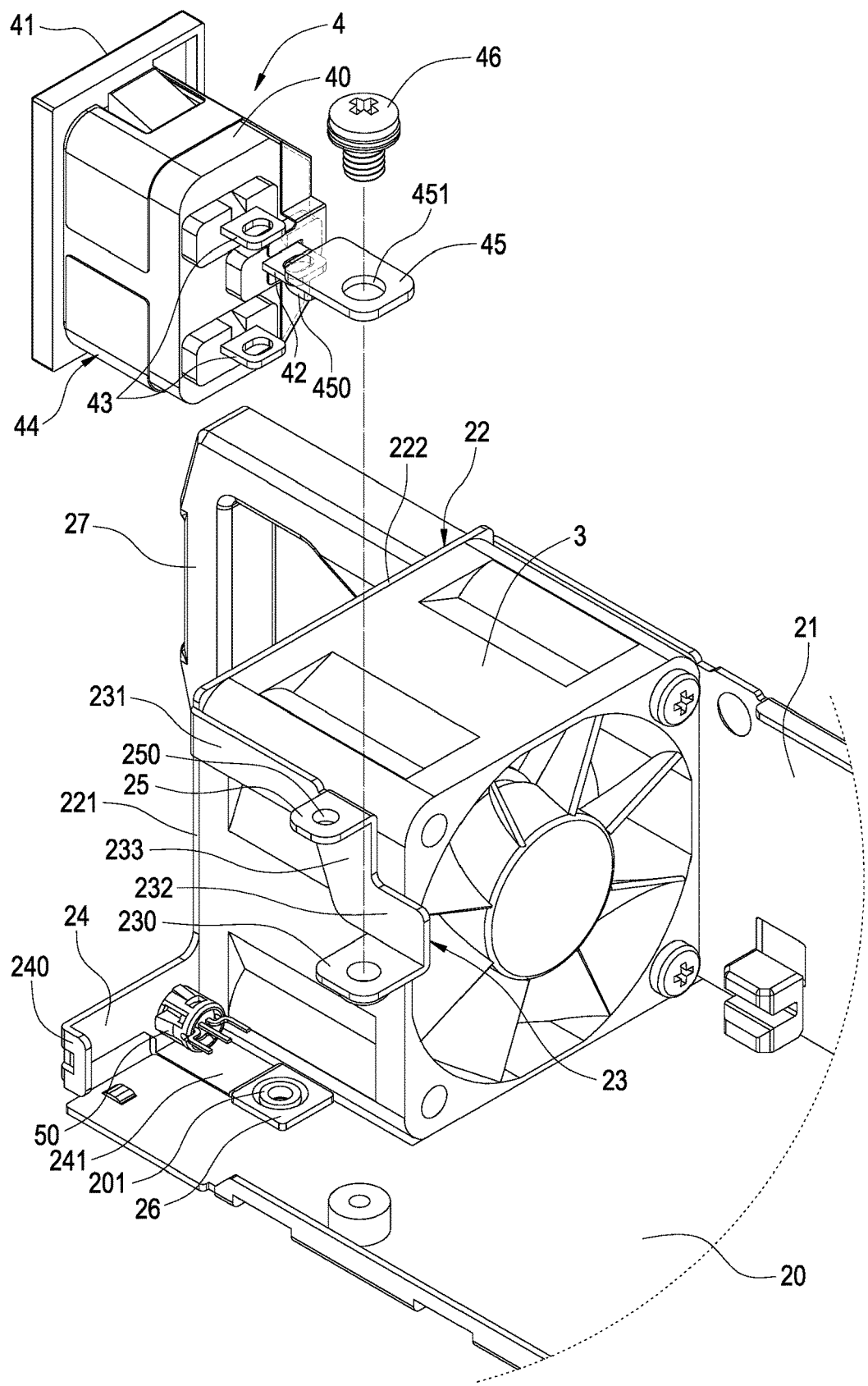
FIG. 12 is a partial exploded view of the second housing, the wind generating unit and the power socket of the present disclosure from another viewing angle.
Figure 13:
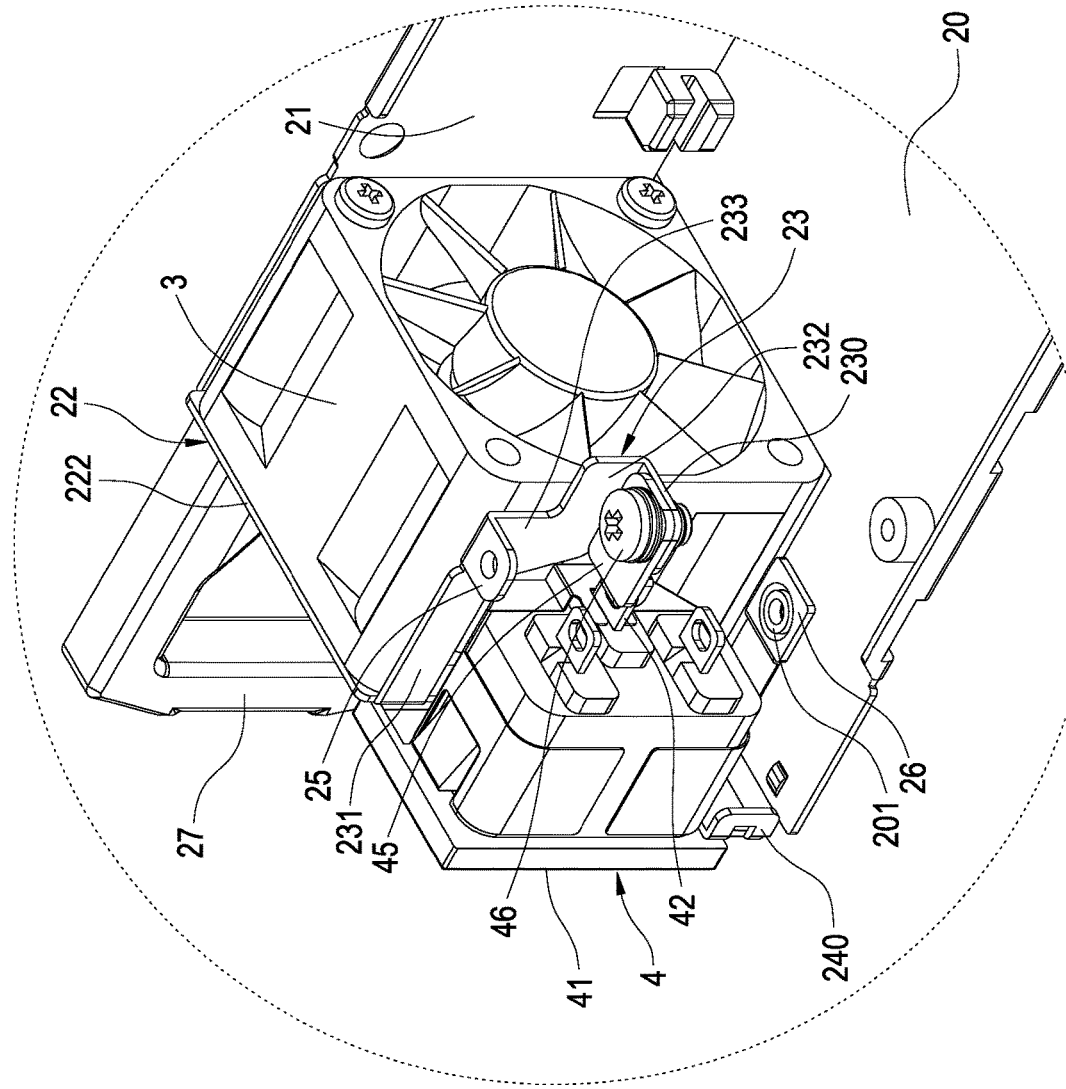
FIG. 13 is a partial assembly view of the second housing, the wind generating unit and the power socket of the present disclosure from another viewing angle.

As shown in FIG. 6 to FIG. 8, the space between the lateral cutting edge 221 of the ventilation bracket 22 and the first side portion 11 of the first housing 1 is provided for the installation of the power socket 4, as shown in FIG. 11 to FIG. 13. In addition, as shown in FIG. 10 and FIG. 11, the power socket 4 includes a socket main body 40, the front end of the socket main body 40 includes an insertion port 400, and a flange 41 is formed at the external of the insertion port 400. In addition, the internal of the insertion port 400 includes a plurality of pins 42 and 43 extended outward from the rear end 40a of the socket main body 40, and at least one of the pins 42 is used for grounding. Please refer to FIG. 10, FIG. 11, and/or FIG. 14, the shape of the insertion port 400 includes two foolproof bevels 400a. The external of the socket main body 40 includes two slanted surfaces 40b corresponding to the two foolproof bevels 400a respectively. The two slanted surfaces 40b are extended from the front end of the socket main body 40 to the rear end 40b. The surface 40c connected with the two slanted surface 40b of the socket main body 40 is adjacent to or in contact with the wind generating unit 3, as shown in FIG. 14. Accordingly, the wind generating unit 3 and the power socket 4 of the present disclosure are arranged side by side with each other, such that unnecessary space is minimized and its width W is reduced as much as possible. Furthermore, the power socket 4 includes a shielding housing 44 arranged at the external of the socket main body 40. The shielding housing 44 includes a connecting portion 440, and two slanted shielding portions 441 are extended from the connecting portion 440 corresponding to the two slanted surface 40b. In addition, the first shielding portion 442 and the second shielding portion 443 are bent from the rest of the surfaces of the socket main body 40 and arranged corresponding to the two slanted shielding portions 441. A hollow area 441a between the two slanted shielding portions 441 is corresponding to the surface 40c connected with the two slanted surfaces 40b of the socket main body 40 to be a hollow shape. Consequently, it is able to prevent any increase of the gap between the wind generating unit 3 and the insertion main body 40, or it is able to further allow the socket main body 40 to contact with the wind generating unit 3 directly via its surface 40c to reduce the gap.

Please refer to FIG. 6 to FIG. 9. According to an exemplary embodiment of the present disclosure, the ventilation bracket 22 further includes a grounding portion 23 provided for the grounding of the pin 42 of the power socket 4. In addition, it also has the function of securing the ventilation bracket 22 such that it is maintained within the range of the width W (as shown in FIG. 14) of the power module. The grounding portion 23 is extended outward from the lateral cutting edge 221 and extended along one of the slanted surfaces 40b (in an exemplary embodiment of the present disclosure, the slanted surface 40b adjacent to the first plate 10 is used as an example; the slanted surface 40b adjacent to the second plate 20 may also be used as an example) to the rear end 40a of the socket main body 40 to reach the pin 42 of the power socket 4 for grounding. The grounding portion 23 includes a horizontal carrying portion 230 and an extension section 231 extended from the horizontal carrying portion 230 toward the internal of the ventilation bracket 22. The connecting area between the extension section 231 and the horizontal carrying portion 230 may further includes a vertical portion 232, such that the extension section 231 in the vertical position with the folding design of the horizontal carrying portion 230 and the vertical portion 232 is able to change the horizontal carrying portion 230 to a horizontal arrangement. Moreover, to match with the location of the grounding pin 42 of the power socket 4, a slanted section 233 is arranged between the extension section 231 and the vertical portion 232. The slanted section 233 may allow the horizontal carrying portion 230 to be installed on the grounding pin 42 of the power socket 4 at an upper or lower stacking position depending upon the height difference between the extending position of the extension section 231 from the lateral cutting edge 221 and the location of the grounding pin 42 of the power socket 4.

Figure 9:
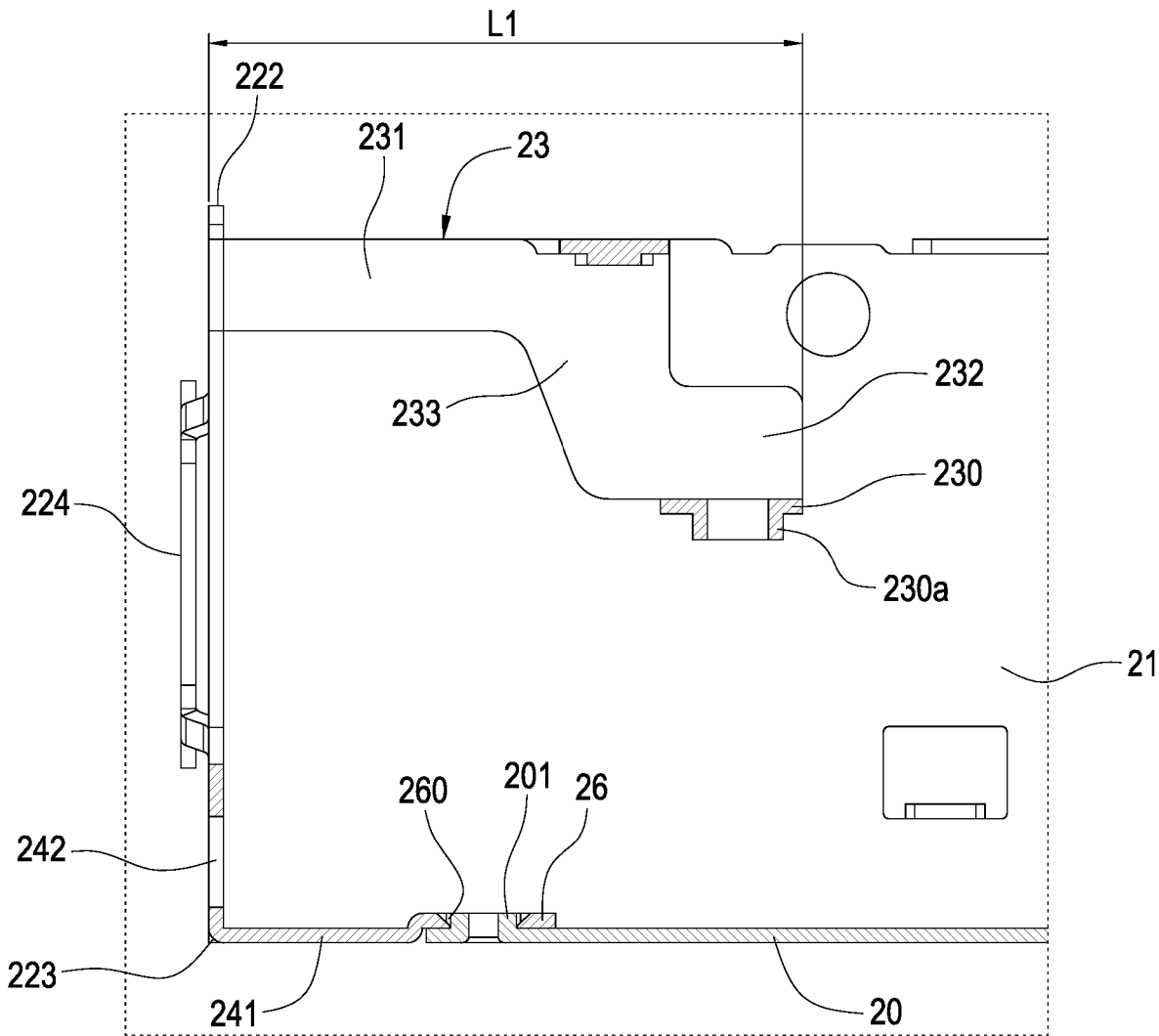
FIG. 9 is a partial side view of the second housing of the present disclosure.

To be more specific, as shown in FIG. 10, to comply or satisfy requirements, such as safety requirements, the pin 42 of the power socket 4 may include a locking hole 420, and a locking slab 45 is provided for locking the pin 42. In addition, the locking slab includes a hook portion 450 for hooking onto the pin 42. Furthermore, please refer to FIG. 12 and FIG. 13. The locking slab 45 is stacked on the horizontal carrying portion 230, and to be more specific, the locking slab 45 is stacked on top of the horizontal carrying portion 230 and a fastening element 46 is used for securement. Moreover, the bottom of the horizontal carrying portion 230 includes a hole seat 230a penetrating through the horizontal carrying portion 230, as shown in FIG. 9. The fastening element 46 penetrates through the perforation 451 on the locking slab 45 to perform fastening and securement toward the hole seat 230a.

In addition, please refer to FIG. 6 to FIG. 9. In an exemplary embodiment of the present disclosure, the ventilation bracket 22 further includes a frame portion 24. In this exemplary embodiment of the present disclosure, the frame portion 24 is adjacent to the second plate 20 correspondingly and extended to the first side portion 11 for locking, and a securement hole is defined by the frame portion 24, the first plate 10, the first side portion 11, and lateral cutting edge 221 of the ventilation bracket 22 to secure the socket main body 40 therein. The rear end of the frame portion 24 includes a locking edge 240 bent and locked inside the first side portion 11. Since the frame portion 24 avoids the location being occupied by the power socket 4, the width W is not increased due to the locking position between the locking edge 240 and the first side portion 11, and the bonding strength between the second plate 20 and the first side portion 11 is enhanced at the same time.

According to the above description, the ventilation bracket 22 includes at least one securement portion 25 or 26. To be more specific, it may be divided into a first securement portion 25 and a second securement portion 26. The first securement portion 25 may be located on the grounding portion 23, such as in the extending direction of the extension section 231 from the grounding portion 23, and may also be bent corresponding to the first plate 10 for fastening securement. To be more specific, the first securement portion 25 includes a fastening hole 250, and a screw 251 (as shown in FIG. 4), may be used to penetrate through the perforation 101 on the first plate 10 to fasten the first securement portion 25, such that the grounding portion 23 may be firmly fastened on the first plate 10. As a result, the overall structural strength of the ventilation bracket 22 is increased, and the first housing 1 and the second housing 2 may be firmly attached to each other via the ventilation bracket 22, thereby enhancing the rigidity and structural strength of the power module in the housing. The second securement portion 26 may be located on the frame portion 24 and bent toward the second plate 20. To be more specific, as shown in FIG. 9, the frame portion 24 may include an extension portion 241 extended and bent toward the second plate 20 and further connected to the second securement portion 26. Furthermore, the second securement portion 26 includes a riveting hole 260, and the second plate 20 includes a riveting edge 201 corresponding to the riveting hole 260. The riveting edge 201 penetrates into the riveting hole 260 to be riveted with the second securement portion 26, thereby securing the second securement portion 26 and the second plate 20. In addition, the frame portion 24 may also include a light emitting element 50 arranged thereon. In other words, the frame portion 24 includes an installation hole 242 provided for the installation of the light emitting element 50. The light emitting element 50 may be a LED light electrically connected to the circuit board 5 to indicate the power connection and other states of the power module. Furthermore, to facilitate the removal of the power module from the server chassis, the handle 27 may be arranged at one side of the ventilation bracket 22, and it may be adjacent to one side of the connecting edge 220 of the ventilation bracket 22.

Figure 15:
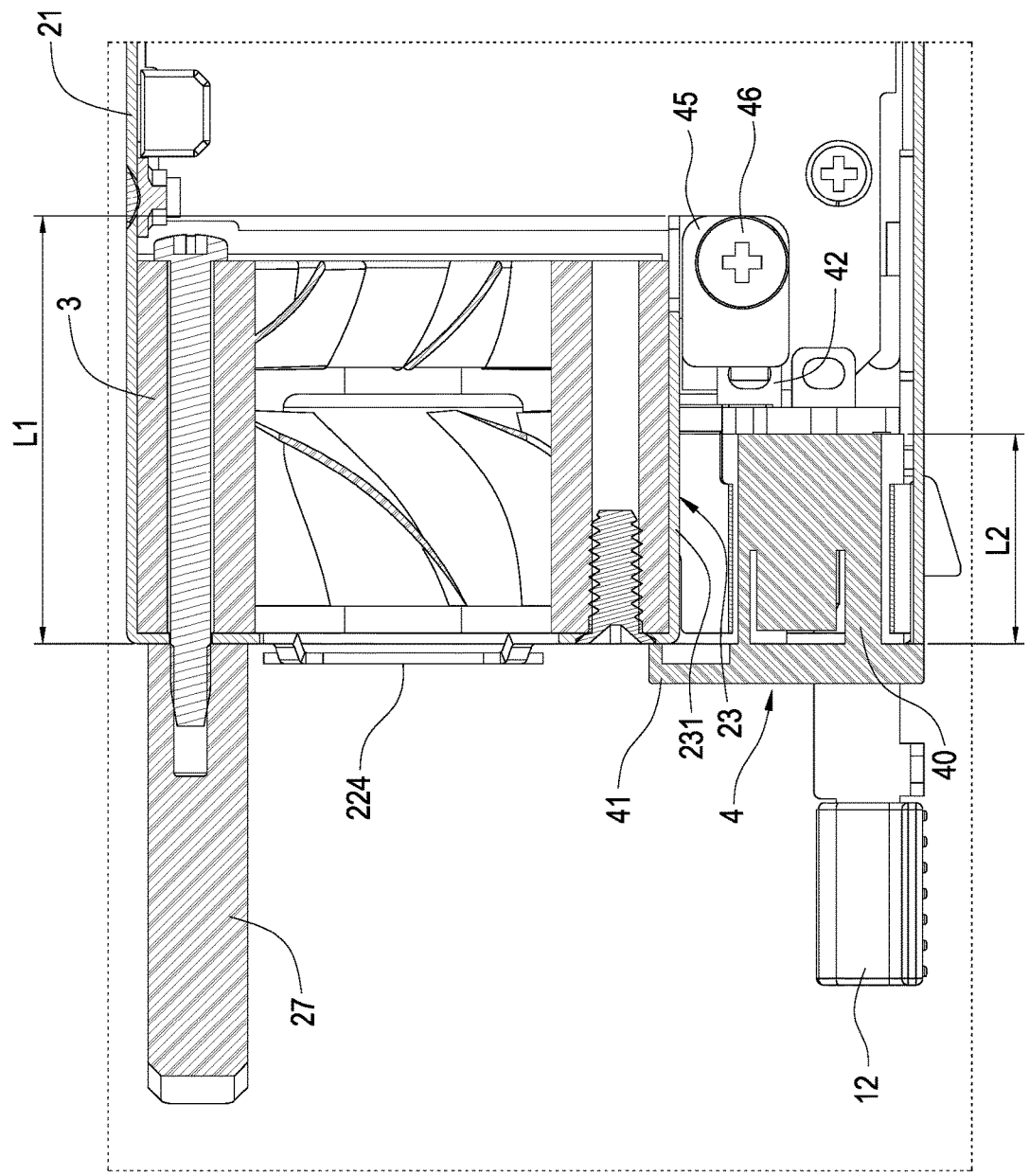
FIG. 15 is a cross sectional side view of the present disclosure.

Moreover, as shown in FIG. 14 and FIG. 15, the present disclosure further utilizes the necessary structure or shape with respect to the specification of the power socket 4, such that it is able to create space with the wind generating unit 3 and to use such space effectively. As shown in FIG. 14, a thickness T of the grounding portion 23 is smaller than or equal to a spacing S1 formed by any one of the slanted surfaces 40b projecting to the first plate 10 or the second plate 20 (i.e., T is smaller than or equal to S1). In addition, a height H of the grounding portion is also smaller than or equal to a spacing S2 formed by any one of the slanted surfaces 40b projecting to the first side portion 11 or the second side portion 21 plus a spacing D between the socket main body 40 and the first plate 10 or second plate 20 (i.e., H is smaller than or equal to S2+D). In addition, as shown in FIG. 15, a length L1 of the grounding portion 23 is greater than or equal to a length L2 of the power socket 4 extended from the rear side of the flange 41 to the rear end 40a of the socket main body 40. In an exemplary embodiment of the present disclosure, the overall length L1 of the grounding portion 23 is formed by the extension section 231, the slanted section 233 and the vertical portion 232, as show in FIG. 9. The present disclosure is not limited to such configuration only. The present disclosure utilizes the space formed by the two slanted surfaces 40b on the socket main body 40 to allow the installation of the grounding portion 23 such that the overall width W is not occupied or used. In addition, the grounding portion 23 may be effectively used for the arrangement of the first securement portion 25, thereby allowing the ventilation bracket 22 to be attached to the first housing 1 and further ensuring the structural strength between the ventilation bracket 22 and the first housing 1. Furthermore, the space formed between the power socket 4 and the first plate 10 or the second plate 2 may be used for the installation of the frame portion 24, and the remaining small space may also be further used effectively to install the second securement portion 26. As a result, the ventilation bracket 22 is attached to the second housing 2 to ensure the structural strength between the ventilation bracket 22 and the second housing 2. As a result, the overall width W is not occupied by the attachment structure of the ventilation bracket 22 with the first housing 1 or the second housing 2, and the attachment among such parts are able to further maintain the rigidity and structural strength of the housing at the same time. Furthermore, the retainer 12 arranged on the first housing 1 may use the space between the power socket 4 and the first plate 10 or the second plate 20 for the installation.

Please refer to FIG. 15. It shall be noted that: when the power socket 4 includes the flange 41, one side of the flange 41 adjacent to the ventilation bracket 22 is able to cover the lateral cutting edge 221 of the ventilation bracket 22, and another side of the flange 41 adjacent to the first side portion 11 is able to cover the first side portion 11. As a result, the width W is not increased or occupied due to the flange 41. For the condition where the power socket 4 is not equipped with the flange 41, then, basically, the insertion port 400 may be aligned substantially with the ventilation bracket 22.

The above description is provided to illustrate the exemplary embodiments of the present disclosure only such that it shall not be treated as limitation to the claimed scope of the present disclosure. In addition, any equivalent modification made based on the present disclosure shall be considered to be within the claimed scope of the present disclosure.

What is claimed is:

1. A power module structure, comprising:
   a first housing, comprising a first plate and a first side portion;
   a second housing, attached to the first housing and comprising a second plate and a second side portion, the second plate arranged opposite to the first plate, the second side portion arranged opposite to the first side portion, and a ventilation bracket integrally bent and extended from the second housing;
   a wind generating unit, arranged on the ventilation bracket; and
   a power socket, arranged side by side with the wind generating unit between the first plate and the second plate;

wherein the ventilation bracket comprises a securement portion, and the securement portion is extended to inside of the first plate or the second plate to be secured, wherein the power socket comprises a socket main body and a plurality of pins extended from a rear end of the socket main body, the socket main body comprises an insertion port defined on a front end thereof, the insertion port comprises two foolproof bevels in shape, the socket main body comprises two slanted surfaces corresponding to the two foolproof bevels respectively and extended from the front end of the socket main body to the rear end of the socket main body, and a surface of the socket main body connected with the two slanted surfaces is adjacent to or in contact with the wind generating unit, wherein the ventilation bracket comprises a grounding portion, the grounding portion is extended to the rear end of the socket main body along one of the slanted surfaces and is grounded with one of the pins.

2. The power module structure according to claim 1, wherein the power socket comprises a shielding housing arranged outside the socket main body, and the shielding housing is in a hollow shape at a location corresponding to the surface of the socket main body connected with the two slanted surfaces.

3. The power module structure according to claim 1, wherein the grounding portion comprises a horizontal carrying portion is located at the grounding portion extended to the rear end of the socket main body and is bent from the grounding portion, a locking slab is stacked on the horizontal carrying portion for securement, and the locking slab comprises a hook portion to be hooked on the pin.

4. The power module structure according to claim 1, wherein the grounding portion is extended from one side of the ventilation bracket adjacent to the power socket, and the securement portion is located at an extending direction of the grounding portion and is bent from the grounding portion.

5. The power module structure according to claim 4, wherein the grounding portion corresponds to one of the slanted surfaces which is adjacent to the first plate, the ventilation bracket further comprises a frame portion, the frame portion is adjacent to the second plate correspondingly and extended to the first side portion for locking, and a securement hole is defined by the frame portion, the first plate, the first side portion and the ventilation bracket to secure the socket main body therein.

6. The power module structure according to claim 5, wherein the securement portion is located on the frame portion and is bent toward the first plate or the second plate.

7. The power module structure according to claim 1, wherein a thickness of the grounding portion is smaller than or equal to a spacing defined by one of the slanted surfaces projecting to the first plate or the second plate, a height of the grounding portion is smaller than or equal to a spacing defined by one of the slanted surfaces projecting to the first side portion or the second side portion plus a spacing between the socket main body and the first plate or the second plate, and a length of the grounding portion is greater than or equal to a length of the socket main body.

8. A power module structure, comprising:
a first housing, comprising a first plate and a first side portion;
a second housing, attached to the first housing and comprising a second plate and a second side portion, the second plate arranged opposite to the first plate, the second side portion arranged opposite to the first side portion, and a ventilation bracket integrally bent and extended from the second housing;
a wind generating unit, arranged on the ventilation bracket; and
a power socket, arranged side by side with the wind generating unit between the first plate and the second plate, comprising a socket main body and a plurality of pins extended from a rear end of the socket main body, the socket main body comprising an insertion port defined on a front end thereof, the insertion port comprising two foolproof bevels in shape, and the socket main body comprising two slanted surfaces corresponding to the two foolproof bevels respectively and extended from the front end of the socket main body to the rear end of the socket main body;
wherein the ventilation bracket comprises a grounding portion, and the grounding portion is extended to the rear end of the socket main body along one of the slanted surfaces and is grounded with one of the pins.

9. The power module structure according to claim 8, wherein the power socket comprises a shielding housing arranged outside the socket main body, and the shielding housing is in a hollow shape at a location corresponding to a surface of the socket main body connected with the two slanted surfaces.

10. The power module structure according to claim 8, wherein a thickness of the grounding portion is smaller than or equal to a spacing defined by one of the slanted surfaces projecting to the first plate or the second plate, a height of the grounding portion is smaller than or equal to a spacing defined by one of the slanted surfaces projecting to the first plate or the second plate plus a spacing between the socket main body and the first plate or second plate, and a length of the grounding portion is greater than or equal to a length of the socket main body.

11. The power module structure according to claim 8, wherein the grounding portion comprises a horizontal carrying portion is located at the grounding portion extended to the rear end of the socket main body and is bent from the grounding portion, a locking slab is stacked on the horizontal carrying portion for securement, and the locking slab comprises a hook portion to be hooked on the pin.

12. The power module structure according to claim 8, wherein the grounding portion is extended from one side of the ventilation bracket adjacent to the power socket, the grounding portion comprises a first securement portion, and the first securement portion is secured to the first plate.

13. The power module structure according to claim 12, wherein the grounding portion corresponds to one of the slanted surfaces which is adjacent to the first plate, the ventilation bracket further comprises a frame portion, the frame portion is adjacent to the second plate correspondingly and extended to the first side portion for locking, and the frame portion includes a second securement portion secured to the second plate.

14. The power module structure according to claim 13, wherein a securement hole is defined by the frame portion, the first plate, the first side portion, and the ventilation bracket to secure the socket main body therein.

15. A power module structure, comprising:
a first housing, comprising a first plate and a first side portion;
a second housing, attached to the first housing and comprising a second plate and a second side portion, the second plate arranged opposite to the first plate, the second side portion arranged opposite to the first side portion, and a ventilation bracket integrally bent and extended from the second housing;

a wind generating unit, arranged on the ventilation bracket; and a power socket, arranged side by side with the wind generating unit between the first plate and the second plate, comprising a socket main body and a plurality of pins extended from a rear end of the socket main body, the socket main body comprising an insertion port defined on a front end thereof, the insertion port comprising two foolproof bevels in shape, and the socket main body comprising two slanted surfaces corresponding to the two foolproof bevels respectively and extended from the front end of the socket main body to the rear end of the socket main body;

wherein the ventilation bracket comprises a grounding portion, the grounding portion is extended to the rear end of the socket main body along one of the slanted surfaces and is grounded with one of the pins, the ventilation bracket further comprises a first securement portion and a second securement portion, the first securement portion is secured to the first plate, and the second securement portion is secured to the second plate.

16. The power module structure according to claim 15, wherein the grounding portion is extended from one side of the ventilation bracket adjacent to the power socket, and the first securement portion is located at an extending direction of the grounding portion and is bent from the grounding portion.

17. The power module structure according to claim 15, wherein the grounding portion is corresponds to one of the slanted surfaces which is adjacent to the first plate, the ventilation bracket further comprises a frame portion, the frame portion is adjacent to the second plate correspondingly and extended to the first side portion for locking, and a securement hole is defined by the frame portion, the first plate, the first side portion, and the ventilation bracket to secure the socket main body therein.

18. The power module structure according to claim 17, wherein the second securement portion is located on the frame portion and is bent toward the second plate.

* * * * *